(12) United States Patent
Wilhelmsson et al.

(10) Patent No.: US 11,329,703 B2
(45) Date of Patent: May 10, 2022

(54) TRANSMITTER, COMMUNICATION APPARATUS, METHOD AND COMPUTER PROGRAM FOR TRANSMITTING AMPLITUDE SHIFT KEYED SIGNALS USING MULTIPLE TRANSMIT ANTENNAS

(71) Applicant: Telefonaktiebolaget LM Ericsson (publ), Stockholm (SE)

(72) Inventors: Leif Wilhelmsson, Lund (SE); Erik G. Larsson, Linköping (SE); Emil Björnson, Hägersten (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 8 days.

(21) Appl. No.: 17/058,749

(22) PCT Filed: Jun. 20, 2018

(86) PCT No.: PCT/EP2018/066372
§ 371 (c)(1),
(2) Date: Nov. 25, 2020

(87) PCT Pub. No.: WO2019/242849
PCT Pub. Date: Dec. 26, 2019

(65) Prior Publication Data
US 2021/0211165 A1 Jul. 8, 2021

(51) Int. Cl.
*H04B 7/02* (2018.01)
*H04B 7/0456* (2017.01)
(Continued)

(52) U.S. Cl.
CPC ......... *H04B 7/0456* (2013.01); *H04L 5/0048* (2013.01); *H04L 27/04* (2013.01)

(58) Field of Classification Search
CPC ...... H04B 7/0456; H04L 5/0048; H04L 27/04
(Continued)

(56) References Cited

U.S. PATENT DOCUMENTS

2012/0328042 A1* 12/2012 Jang ................. H03M 13/6525
375/285
2014/0140422 A1* 5/2014 Li ....................... H04L 5/0007
375/260
(Continued)

FOREIGN PATENT DOCUMENTS

WO 2017152929 A1 9/2017
WO 2017172983 A1 10/2017

OTHER PUBLICATIONS

Azizi, S., "IEEE 802.11 TGba Simulation Scenarios and Evaluation Methodology Document", IEEE P802.11 Wireless LANs, Jan. 1, 2017, pp. 1-7, IEEE 802.11-17/0188r10, IEEE.
(Continued)

*Primary Examiner* — Zewdu A Kassa
(74) *Attorney, Agent, or Firm* — Coats & Bennett, PLLC

(57) ABSTRACT

A method of transmitting an amplitude shift keyed signal uses a multi-layered transmission over a plurality of transmit antennas with different precoding of different symbols for the respective layers. The method comprises obtaining a sequence of bits to be conveyed, keying the sequence of bits to a signal, precoding the signal to respective layer, and transmitting the precoded signal. A transmitter for transmitting the amplitude shift keyed signal, and a computer program for implementing the method are also disclosed.

20 Claims, 5 Drawing Sheets

(51) Int. Cl.
*H04L 5/00* (2006.01)
*H04L 27/04* (2006.01)

(58) Field of Classification Search
USPC ............... 375/267, 261, 259, 295, 219, 316
See application file for complete search history.

(56) References Cited

U.S. PATENT DOCUMENTS

2015/0029979 A1* 1/2015 Onodera ............. H04B 7/0404
370/329
2020/0287759 A1* 9/2020 Van Nee ............. H04L 27/2608

OTHER PUBLICATIONS

Zhang, F. et al., "Further Discussion on the Design of STBC-MLC Scheme for Different Set Partitioning", 2005 IEEE Pacific Rim Conference on Communications, Computers and Signal Processing, Aug. 24, 2005, pp. 57-60, IEEE.

Shellhammer, S. et al., "Proposed Draft WUR PHY Specification", IEEE P802.11 Wireless LANs, Jan. 1, 2018, pp. 1-15, LB2005, IEEE.

Kristem, V. et al., "Updated Results on WUR Performance with Multiple TX Antennas", May 7, 2018, pp. 1-19, IEEE 802.11-18/-0772r0, IEEE.

* cited by examiner

TRANSMITTER, COMMUNICATION APPARATUS, METHOD AND COMPUTER PROGRAM FOR TRANSMITTING AMPLITUDE SHIFT KEYED SIGNALS USING MULTIPLE TRANSMIT ANTENNAS

The project leading to this application has received funding from the European Union's Horizon 2020 research and innovation programme under grant agreement No 641985.

TECHNICAL FIELD

The present disclosure generally relates to a transmitter, a communication apparatus, methods therefor, and computer programs for implementing the methods. In particular, the disclosure relates to transmitting a wireless signal carrying binary information in a way less prone to fading.

BACKGROUND

The telecommunications domain has often so forth been accompanied by a significant increase of electrical energy consumption. Demands on performance, such as spectral efficiency or data rate, have been met at the expense of more energy consumption. Advances in analogue and digital electronics have enabled development of low-cost, low-energy wireless nodes. However, energy consumption remains an issue for some applications. The approach used for idle mode listening, especially when used by devices related to the field commonly referred to as Internet of Things, IoT, in wireless networks impacts the overall energy consumption for the devices. This is particularly noticeable when the data traffic is very sporadic.

Energy reduction may for example be performed by an approach in which it is possible to switch off a radio frequency main interface during inactive periods and to switch it on only if a communication demand occurs. For example, by using a wake-up radio, WUR, where a wake-up signal is sent by using a transmitter, received and decoded at the device by the WUR, and wherein the main radio is activated by the WUR, significant energy consumption reduction may be achieved for many applications.

Furthermore, efforts to reduce energy consumption may be made at different levels of the communication stack, such as the medium access control (MAC) protocol, by dynamically adapting the sleep and wake times of main radio protocols. Limited complexity signals and thus limited complexity decoders for the intermittently presented control signals may improve energy efficiency.

These efforts affect the physical layer (PHY), where control mechanisms for activation or deactivation of more energy consuming operations reside, which put demands on lean control signalling.

An example in the PHY is application of an On-Off Keying, OOK, signal as illustrated in FIG. 1, which is a modulation scheme where the presence of a signal represents the ON part or state and the absence of the signal represents the OFF part or state. For example, the ON and OFF parts could represent binary digits. OOK is considered the simplest form of amplitude-shift keying, ASK, that represents digital data as the presence or absence of a signal. In its simplest form, the presence of a carrier for a specific duration represents a binary one, while its absence for the same duration represents a binary zero. Some more sophisticated schemes may vary these durations to convey additional information. OOK is analogous to unipolar encoding, which is a special case of a line code. OOK is a suitable modulation to use whenever the power consumption of the receiver is a major concern, as the demodulation can be done non-coherently, with very relaxed requirements on gain control and resolution in the receiver.

In order to decode OOK, the receiver has to estimate which signal level corresponds to the presence of a signal and which signal level corresponds to the absence of a signal. Manchester Coding is a modulation means where the transition between ON to OFF state and OFF to ON state could represent binary digits, and may be used to simplify clock recovery and to simplify demodulation by ensuring that the average signal level of the signal carries no information. FIG. 2 illustrates a data bit with value one is represented by, i.e. encoded to, a logical one followed by a logical zero, whereas a data bit with value zero is represented by a logical zero followed by a logical one. Alternatively, the encoding can be swapped so that a data bit with value one is represented by a logical zero followed by a logical one, etc.

Clock recovery is simplified because there will always be a transition from zero to one or vice versa in the middle of each symbol irrespectively of what the data is.

The decoding of the Manchester coded symbol is essentially done by comparing the first and the second half of the symbols and deciding in favour of a logical one if the first half of the symbol has larger energy than the second half of the same symbol, or vice versa. Instead of energy, one can also use other means of measuring the signal level, for example absolute signal-envelope averaged over the symbol duration.

For example, Manchester coded OOK is being standardized within the IEEE 802.11ba task group (TG). TG 802.11ba develops a standard for wake-up radios (WUR), targeting to significantly reduce the power consumption in devices based on the 802.11 standard. It is proposed to generate the wake-up signal (WUS) by using an inverse fast Fourier transform (IFFT), as this block is already available in Wi-Fi transmitters supporting e.g. 802.11a/g/n/ac. Specifically, an approach discussed for generating the OOK is to use the 13 sub-carriers in the centre, possibly excluding the DC carrier, and then populating these with some signal to represent ON and to not transmit anything at all to represent OFF.

IEEE document IEEE 802.11-17/0188r10, with title "IEEE 802.11 TGba Simulation Scenarios and Evaluation Methodology Document" by Shahrnaz Azizi et al, defines simulation scenarios, evaluation criteria and methodology to be used for evaluation of performance of features and generation of simulation results.

SUMMARY

The disclosure is based on the inventors' understanding that multi-layered transmissions over a plurality of transmit antennas may improve performance.

According to a first aspect, there is provided a method of transmitting an amplitude shift keyed signal using a multi-layered transmission over a plurality of transmit antennas with different precoding of different symbols for the respective layers. The method comprises obtaining a sequence of bits to be conveyed, keying the sequence of bits to a signal, precoding the signal to respective layer, and transmitting the precoded signal.

The keying of the bits may comprise Manchester coding the bits.

The precoding to respective layer may be performed on a line for respective layer of a precoding matrix. Here, a line may be a row or a column of the matrix, depending on implementation. The method may comprise selecting the precoding matrix from a set of matrices. The selecting of the precoding matrix may be based on a mapping between precoding matrix and addressed receiver of the transmission. Multiple signals may be multiplexed in the transmission, and the selecting of the precoding matrix may be based on a mapping between respective multiplexed signal and respective precoding matrix. For each matrix of the set of matrices, two of the lines may be the same for all matrices and are arranged to be used for pilot symbols.

Each layer may be transmitted by a respective antenna or set of antennas of the plurality of transmit antennas.

The precoding may be performed by assigning a first part of the signal to a first layer, and assigning a second part of the signal to a second layer. The second part of the signal may be a repeated replica of the first part of the signal.

The precoding may be performed by assigning symbols for a first bit value to a first layer, and assigning symbols for a second bit value to a second layer.

At least a part of the sequence may comprise pilot bits. The part of the signal corresponding to the pilot bits may be precoded according to a predetermined precoding pattern.

According to a second aspect, there is provided a computer program comprising instructions which, when executed on a processor of a transmitter, causes the transmitter to perform the method according to the first aspect.

According to a third aspect, there is provided a transmitter for transmitting an amplitude shift keyed signal provided over a multi-layered transmission over a plurality of transmit antennas with different precoding of different symbols for the respective layers. The transmitter is arranged to obtain a sequence of bits to be conveyed, key the sequence of bits to a signal, precode the signal to respective layer, and transmit the precoded signal.

The keying of the bits may comprise Manchester coding of the bits.

For respective layer, a line of a precoding matrix may determine the precoding for respective layer. Here, a line may be a row or a column of the precoding matrix, depending on implementation. The transmitter may be arranged to select the precoding matrix from a set of matrices. The selection of the precoding matrix may be based on a mapping between precoding matrix and addressed receiver of the transmission. Multiple signals may be multiplexed in the transmission, and the selection of the precoding matrix may be based on a mapping between respective multiplexed signal and respective precoding matrix. For each matrix of the set of matrices, two of the lines may be the same for all matrices and are arranged to be used for pilot symbols.

The transmitter may comprise the multiple transmit antennas, wherein each layer may be transmitted by a respective antenna or set of antennas of the plurality of transmit antennas.

The precoding may include that a first part of the signal is assigned to a first layer, and a second part of the signal is assigned to a second layer. The second part of the signal may be a repeated replica of the first part of the signal.

The transmitter may be arranged to, for the precoding, assign symbols for a first bit value to a first layer, and assign symbols for a second bit value to a second layer.

At least a part of the sequence may comprise pilot bits. The part of the signal corresponding to the pilot bits may be precoded according to a predetermined precoding pattern.

BRIEF DESCRIPTION OF THE DRAWINGS

The above, as well as additional objects, features and advantages of the present disclosure, will be better understood through the following illustrative and non-limiting detailed description of preferred embodiments of the present disclosure, with reference to the appended drawings.

DETAILED DESCRIPTION

Figure 1:
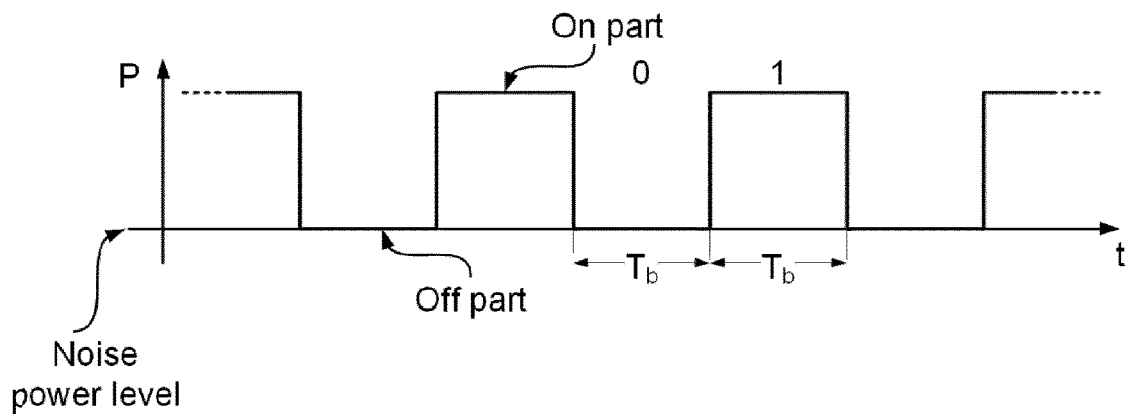
FIG. 1 is a signal diagram schematically illustrating an on-off keying signal.
Figure 2:
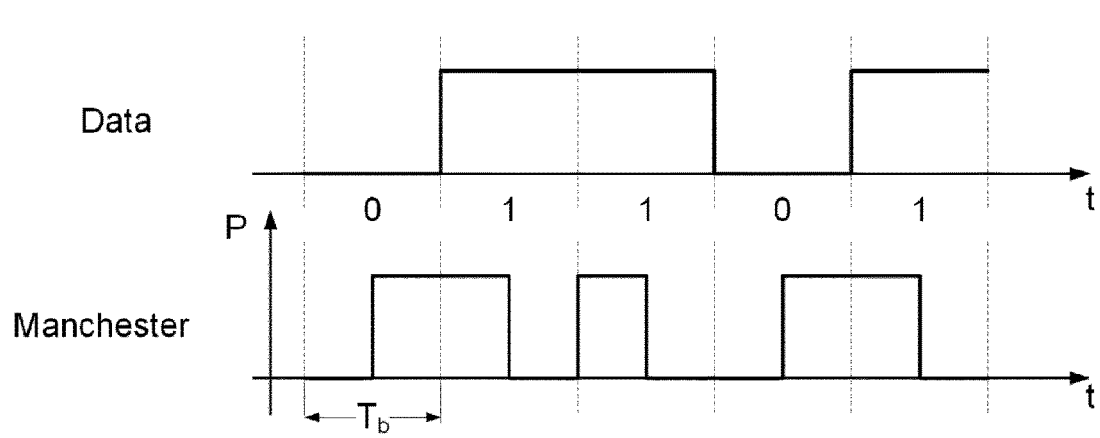
FIG. 2 is a signal diagram which illustrates a data bit with value representation.

Wake-up receivers (WUR), sometimes also referred to as wake-up radios, provide a means to significantly reduce the power consumption in receivers used in wireless communication. The idea with a WUR is that it can be based on a very relaxed architecture, as it only needs to be able to detect the presence of a wake-up signal, but will not be used for any data reception.

A commonly used modulation for the wake-up packet (WUP), i.e., the signal sent to the WUR, is on-off keying (OOK). OOK is a binary modulation amplitude shift keyed approach, where a logical one is represented with sending a signal (ON) whereas a logical zero is represented by not sending a signal (OFF), or vice versa.

There are currently activities ongoing in the IEEE 802.11 task group (TG) named IEEE 802.11ba to standardize the physical (PHY) and medium access control (MAC) layers for a Wake-Up Radio to be used as a companion radio to the 802.11 primary communications radio (PCR) with the mere purpose to significantly reduce the power consumption.

It is proposed to generate the wake-up signal (WUS) by using an inverse fast Fourier transform (IFFT), as this block is already available in Wi-Fi transmitters supporting e.g. IEEE 802.11a/g/n/ac. Specifically, an approach discussed for generating the OOK is to use the 13 sub-carriers in the centre, and then populating these with some signal to represent ON and to not transmit anything at all to represent OFF. The IFFT used in this particular case has 64 points and is operating at a sampling rate of 20 MHz, and just as for ordinary orthogonal frequency division multiplexing (OFDM) a cyclic prefix (CP) is added after the IFFT operation in order to keep the OFDM symbol duration used in 802.11a/g/n/ac and thus be able to spoof legacy stations by prepending a legacy preamble at the beginning of the WUS. In this way legacy stations will be able to detect the WUS and correctly defer access to the wireless medium.

To further ease the reception of the WUP, the wake-up signals (WUSs) are Manchester-coded. That is the transmission of a logical zero" is done by sending OFF followed by ON, while the transmission of a logical one is done by sending ON followed by OFF. The assigning of ON OFF and OFF ON patterns to bit values may equally be the opposite. Depending on the required data rate, one can either send one such ON/OFF-sequence or repeat the ON/OFF-sequence multiple times. Repeating it multiple time effectively corresponds to using a repetition code. That is, a second part of the signal, e.g. symbol or bit representation, is a repeated replica of a first part of the signal.

When a WUS is transmitted over a wireless channel, the amplitude of the received signal is determined by the channel fading. The main benefit of using on-off keying, compared to coherent modulation formats, is that the pattern of ON/OFF transmissions can then be detected non-coherently by an envelope detector. Fading of the wireless channel is an unavoidable practical limitation. If the channel is in a deep fade, then the performance, in sense of range from a practical point of view, of the WUS can be severely reduced. In the above-mentioned IEEE 802.11ba standard, the goal is that the WUR should have the same range as the PCR. If the WUS is more sensitive to fading, e.g. due to that the signal has a smaller bandwidth, this means that the sensitivity may need to be improved in order to allow for a larger fading margin.

The requirement of an improved sensitivity translates into an increased cost as well as an increased power consumption of the WUR, thus reducing the benefit of using a WUR. The suggested approach of this disclosure relies on the assumption that the transmitter of the WUS typically is equipped with multiple antennas, and that neither power consumption nor cost is as critical for the transmitter of the WUS as it is for the WUR.

Specifically, several ways to achieve transmit diversity are disclosed where the reception can be performed in a cost and power efficient way by a simple WUR.

In some embodiments the diversity scheme can be seen as achieving an antenna selection diversity gain, but without the need for the transmitter to know which one of the antennas being selected by the receiver.

In some embodiments the diversity scheme can be seen as achieving an antenna selection diversity gain, but without the need for the transmitter to know how the receiver is using the knowledge of the different channel to make a decision.

Some of the embodiments are especially tailored for Manchester-coded transmission, whereas other embodiments are applicable whether plain OOK or Manchester-coded OOK being used.

The suggested approach allows for improved link performance through an efficient and low complex introduction of transmit diversity. The improved link performance translates into enhanced coverage and reduced power consumption. The invention can also be used to transmit additional information.

The approach above may be used for lean or extremely lean transmissions, such as for wake-up signal to a wake-up radio in a receiver, where the wake-up radio has the purpose of receiving the wake-up signal and upon proper decoding thereof initiate operation of a main transceiver of the receiving entity, wherein the main transceiver commences traffic exchange with e.g. a network node. Here, the network node may be the entity comprising the transmitter discussed above. Features of receivers of such lean or extremely lean transmissions are often that they are low complexity and low power consuming. This normally leads to that they are specified for low bitrate communication. An example is that they are arranged to operate with a $\frac{1}{100}$ to $\frac{1}{1000}$ of what is normally or in feasible operation modes used on a channel between the network node and the receiving entity, in view of the wake-up signal bitrate to bitrate of PCR signal, providing for the extremely lean transmissions for the wake-up signal.

A WUS is transmitted from a transmitter with at least two antennas to a receiving user. For brevity, we exemplify the operation in the case of two transmit antennas. Alternatively, the notation of "antenna 1" and "antenna 2" can be interpreted as virtual antennas created by two different precoding vectors, which are transmitted using more than two antennas. Denote the channel response from antenna 1 to the user by $h_1$ and the channel response from antenna 2 by $h_2$.

The two antennas generally transmit different signals. In the description below, the total transmitted power, denoted p, can be arbitrarily divided between the two transmit antennas. In case there are other constraints on the transmitted power, e.g. that the average power from each antenna is limited, the principle described below may have to be slightly modified. However, since such modification should be possible to do for a person of ordinary skill in the art, the invention is described for the case that the power limitation refers to the total power of the two transmit antennas in order to simplify the description of the basic idea.

The different embodiments will also be described for the case that Manchester coded OOK is used. It is also discussed, for the different embodiments, if the corresponding approaches would be applicable also for plain OOK.

The phase difference between the antennas can also be varied. This variation of phase and power per antenna may be viewed as "precoding". The phase-amplitude differences between the transmitted signals induced by the precoding may be expressed as a "precoding matrix" W where each row corresponds to an antenna and each column corresponds to a time index, or vice versa depending on implementation choice. Herein, the general term "line" will be used for row or column of the matrix.

For example, suppose the precoding is performed with the following matrix:

$$W = \sqrt{p} \begin{bmatrix} 1 & 0 & \frac{1}{\sqrt{2}} & \frac{1}{\sqrt{2}} & \frac{\sqrt{3}}{2} & \frac{\sqrt{3}}{2} \\ 0 & 1 & \frac{1}{\sqrt{2}} & -\frac{1}{\sqrt{2}} & \frac{1}{2} & -\frac{1}{2} \end{bmatrix}$$

The first column $[1\ 0]^T$ represents that, at the first time instant, transmission takes place only through antenna 1, with full power and zero phase-shift. The second column $[0\ 1]^T$ represents that, at the second time instant, all power is transmitted through the second antenna with zero phase-shift. The third column $[1/\sqrt{2}\ 1/\sqrt{2}]^T$ represents that, at the third instant, equal power is transmitted through both antennas, with the same phase. The fourth column $[1/\sqrt{2}\ -1/\sqrt{2}]^T$ represents that, at the fourth time instant, equal power is transmitted through the two antennas, but with a relative phase difference of 180 degrees. The columns of the matrix hence have the role of "precoding vectors".

Figure 3:
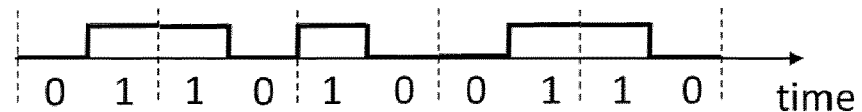
FIG. 3 is a signal diagram schematically illustrating signals propagated through different channels obtained by using different precoding.
Figure 3:
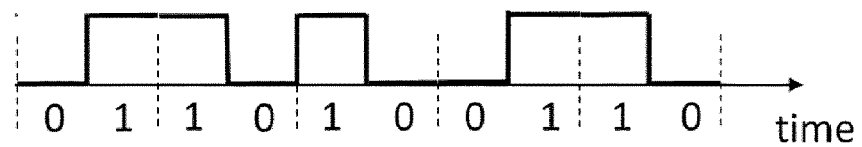

FIG. 3 is a signal diagram schematically illustrating signals propagated through different channels obtained by using different precoding. In the example above, if the first column of W was used constantly at all time instances, the received WUS would look like the upper graph of FIG. 3 (where 0 corresponds to OFF and 1 corresponds to ON). Similarly, if the second column was used at all time instances, the received WUS would look like the lower graph of FIG. 3. In the example, the second antenna has a stronger channel, $|h_2|>|h_1|$. That is, the signal received by antenna 2 contains the same transitions as the signal received by antenna 1, but the received amplitude is higher when transmitting an ON.

Figure 4:
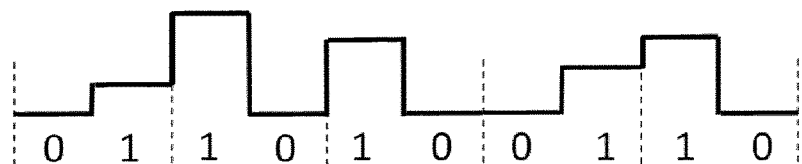
FIG. 4 is a signal diagram schematically illustrating a signal obtained by using varying precoding.

FIG. 4 is a signal diagram schematically illustrating a signal obtained by using varying precoding. By varying the precoding, i.e., the choice of vectors from the precoding matrix W, between each transmission of two consecutive ON-OFF symbols, the received signal may look as illustrated in FIG. 4. Each choice of precoding vector results in a particular received amplitude of the ON transmissions. While transmission from only one of the antennas leads to a constant received amplitude associated with "ON", variation of the precoding results in amplitude variations. These variations can be exploited by the receiver to achieve more efficient transmission.

In the first embodiment, the receiver is enabled to estimate the magnitudes of the channel responses based on the reception of a predefined "pilot pattern" of precoding vectors. For example, if the first two columns in W (as it was defined in the above example) are designated as pilots, the received signals will be, assuming an envelope detector, $$y_1 = |\sqrt{p} h_1 + n_1|$$

when using the first column and $$y_2 = |\sqrt{p} h_2 + n_2|$$

when using the second column, where $n_1$ and $n_2$ represent additive noise. Based on these observations, the amplitudes of the channels can be estimated. For example, a simple estimate of $|h_1|$ is $y_1/\sqrt{p}$ and a simple estimate of $|h_2|$ is $y_2/\sqrt{p}$. These estimators give perfect estimates when the noise is negligible. Other more sophisticated estimators can be utilized as well.

As a continuation of the example, if the first three columns in W are utilized as pilots, the additional received (envelope-detected) signal from using the third column is $$y_3 = \left| \sqrt{\frac{p}{2}} (h_1 + h_2) + n_3 \right|$$

where $n_3$ represents additive noise. By using $y_1, y_2, y_3$, the receiver can not only estimate $|h_1|$ and $|h_2|$, but also the phase differences $\mathrm{Re}\{h_1 h_2^*\}$ and $\mathrm{Im}\{h_1 h_2^*\}$ between the two channels:

$$\mathrm{Re}\{h_1 h_2^*\} = \frac{y_1 + y_2 - 2y_3}{2\sqrt{p}}$$

$$(\mathrm{Im}\{h_1 h_2^*\})^2 = \frac{y_1 y_2}{2p} - \frac{y_1 + y_2 - 2y_3}{2\sqrt{p}}.$$

These estimates are perfect estimates when the noise level is negligible. Other more sophisticated estimators can be utilized as well. For instance, by using a fourth column of W as an additional pilot, the sign of $\mathrm{Im}\{h_1 h_2^*\}$ can also be acquired. Note that only the phase difference between the channels can be estimated (but not the absolute channel phase) since the envelope detector only measures received energy.

A receiver that has estimated the channels can use these estimates to detect which precoding vector that was used for transmitting a particular Manchester-coded symbol.

According to a first embodiment 1, the first few symbols are transmitted with predefined "pilot" precoding vectors to enable channel estimation. The remaining symbols are transmitted with unknown precoding vectors, where the precoding pattern is selected as a function of some information to be conveyed. This information may, for example, represent data or parity bits from a channel code.

It should here be understood that explicit pilots mean some known symbols. These known symbols may either be send solely for the purpose of estimating the channel, but it can also be so that the channel is estimated from a known sequence used for synchronization, such as a synchronization word. In this case, the synchronization word would be known and effectively re-used for channel estimation once it has been used to obtain synchronization.

When there are explicit pilots sent at the beginning of the packet, this idea to transmit additional information works also when the Manchester coding is not used. However, the use of Manchester coding may still be beneficial e.g. to allow for a low complex receiver.

It should here be noted that the transmitter does not have any knowledge about which is the best column in the pre-coding matrix, since the channels $h_1$ and $h_2$ are unknown for the transmitter. If this knowledge would have been available at the transmitter, a suitable pre-coding vector could have been selected.

At the receiver, the pilots are used to determine e.g. the expected received amplitude corresponding to the different pre-coding vectors, i.e., corresponding to the different columns in the pre-coding matrix W. If noise is neglected, the envelope will only be non-zero when the transmitted signal is ON. How this is exploited is further illustrated in connection to the next embodiment.

In a second embodiment, the information can be viewed as conveyed using differential modulation, without relying on predefined "pilot" precoding vectors for channel estimation. The differential modulation is here implemented by means of Manchester coding. Specifically, an information bit "1" may be transmitted by sending OFF-ON, and an information bit "0" may be transmitted by sending OFF-ON, or vice versa. This may be viewed as differential modulation since effectively the information is transmitted in the difference between the first and second half of the symbol.

In one embodiment, a low data rate is used such that each Manchester-coded symbol is transmitted by sending two repeated ON-OFF sequences (i.e., ON OFF ON OFF or OFF ON OFF ON). For each symbol transmission, the first ON/OFF sequence is transmitted with a first, predetermined precoding and the second ON/OFF sequence is transmitted with a second, predetermined precoding. In addition to detecting transitions in the Manchester code, the amplitude level will be different in the first half and the second half of the symbol transmission. This difference in amplitude provides side-information to the symbol detector.

Figure 5:
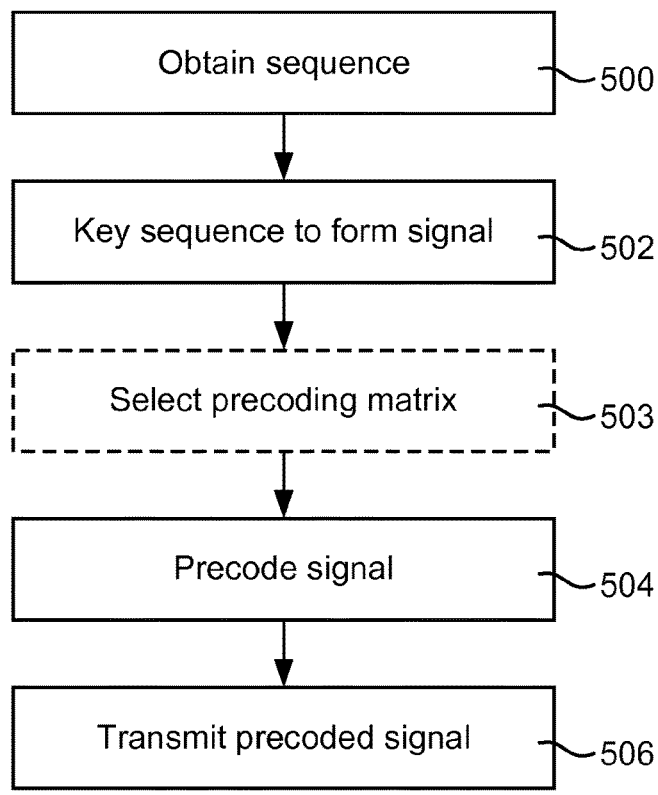
FIG. 5 is a flow chart schematically illustrating a transmitter method according to an embodiment.

For example, if the first two columns of W are used as precoding vectors for the first and second half of a symbol, respectively, then the amplitude side-information is particularly useful when either $|h_2|>>|h_1|$ or $|h_1|>>|h_2|$, which typically occurs when one of the channels is in deep fade and the other is not. The detector may then first estimate $|h_1|$ and $|h_2|$, based on two transmitted pilots, as described above, or by measuring the average received power in the first and second half of a symbol transmission. In case $|h_1|\gg|h_2|$, the detector only uses the first half of each symbol transmission for detection. In case $|h_2|\gg|h_1|$, the detector only uses the second half of each symbol transmission for detection. If none of these cases applies, i.e. $|h_1|$ and $|h_2|$ are approximately equally large, then a conventional detection mode may be used. FIG. 5 is a flow chart schematically illustrating methods of a transmitter according to embodiments demonstrated above. The method is for transmitting an amplitude shift keyed signal provided over a multi-layered transmission with different precoding for the respective layers. Here, the term "layers" refers to the use of multiple antennas transmitting modified versions of a signal, i.e. the signal is given different precodings. The method comprises obtaining 500 a sequence of bits to be conveyed. The sequence is keyed 502, i.e. the bits get a representation, e.g. by Manchester coding, to form the signal. The signal is then precoded 504 to respective layer, and transmitted 506 using two or more of the antennas.

In some embodiments, additional side-information regarding a user, e.g., regarding previously successful transmission of a WUS, spatial directions, or other channel statistics, may be utilized for selecting 503 a precoding for said user. This information can also be used when selecting 503 precoding in view of other users, e.g. to avoid interference.

This example of a scheme that utilizes two transmit antennas to achieve antenna diversity when the receiver is equipped with an envelope detector and each Manchester-coded symbol is transmitted using multiple ON-OFF sequences.

It can also be noted that it would be possible to decode this signal for a "legacy receiver", which would simply decode in a conventional way irrespective of the relation between $|h_1|$ and $|h_2|$, although the decoding may have worse performance.

In another embodiment, a higher data rate is used such that every Manchester-coded symbol is transmitted using only one ON-OFF sequence. In that case, every Manchester-coded "0" is transmitted with a first, predetermined precoding and every Manchester coded "1" is transmitted with a second, predetermined precoding. In addition to detecting transitions in the Manchester code, the amplitude level will be different when transmitting a "0" as compared to when transmitting a "1". This difference in amplitude provides side-information to the symbol detector. For example, if the first two columns of W are used as precoding vectors for "0" respectively "1", then the amplitude side-information is particularly useful when either $|h_2|\gg|h_1|$ or $|h_1|\gg|h_2|$, which typically occurs when one of the channels is in deep fade and the other is not.

In more detail, as exemplification, suppose the precoding is selected such that all "0" symbols are transmitted through antenna 1 and all "1" symbols are transmitted through antenna 2. The detector then first estimates $|h_1|$ and $|h_2|$, based on two transmitted pilots, as described above, or by measuring the average power received in the first and second half of a symbol transmission. In case $|h_2|\gg|h_1|$, the detector can deduce when a "1" was transmitted (assuming the signal-to-noise ratio is sufficient), since in that case the amplitude difference between ON and OFF is particularly large. Specifically, if a "1" is transmitted as OFF ON, then the detector can measure the received signal amplitude in the second half of the symbol interval. If it is larger than a threshold, which is, e.g., determined by the noise variance, the detector concludes that a "1" was transmitted. Otherwise, it concludes that a "0", transmitted as ON OFF, was transmitted. The opposite procedure is applied in case of $|h_1|\gg|h_2|$. This way, antenna diversity is achieved.

Figure 6:
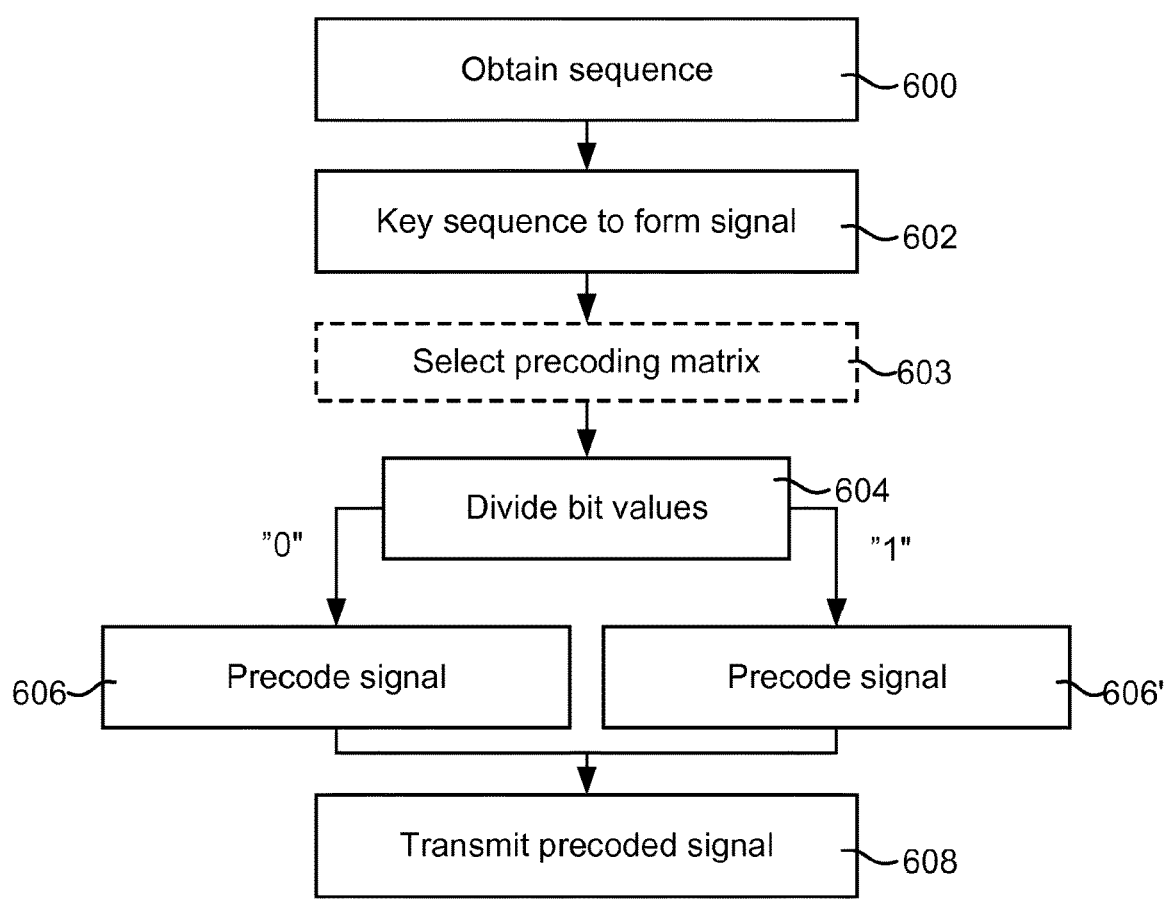
FIG. 6 is a flow chart schematically illustrating a transmitter method according to an embodiment.

FIG. 6 is a flow chart schematically illustrating methods of a transmitter according to the embodiments demonstrated above. The method is for transmitting an amplitude shift keyed signal provided over a multi-layered transmission with different precoding for the respective layers. Here, the term "layers" refers to the use of multiple antennas transmitting modified versions of a signal, i.e. the signal is given different precodings. The method comprises obtaining 600 a sequence of bits to be conveyed. The sequence is keyed 602, i.e. the bits get a representation, e.g. by Manchester coding, to form the signal. The signal is then divided 604 based on bit value, resulting in what may be seen as sub-signals. The respective sub-signal is then precoded 606, 606' to respective layer, and transmitted 608 using two or more of the antennas.

In some embodiments, additional side-information regarding a user, e.g., regarding previously successful transmission of a WUS, spatial directions, or other channel statistics, may be utilized for selecting 603 a precoding for said user. This information can also be used when selecting 603 precoding in view of other users, e.g. to avoid interference.

This example of a scheme that utilizes two transmit antennas to achieve antenna diversity when the receiver is equipped with an envelope detector and each Manchester-coded symbol is transmitted using multiple ON-OFF sequences.

It can also be noted that it would be possible to decode this signal for a "legacy receiver", which would simply decode in a conventional way irrespective of the relation between $|h_1|$ and $|h_2|$. The diversity gain is however not achieved by the legacy receiver. For illustrating the benefits, examples, related to receiver end, are given below for the easier understanding of the approaches.

Figure 7:
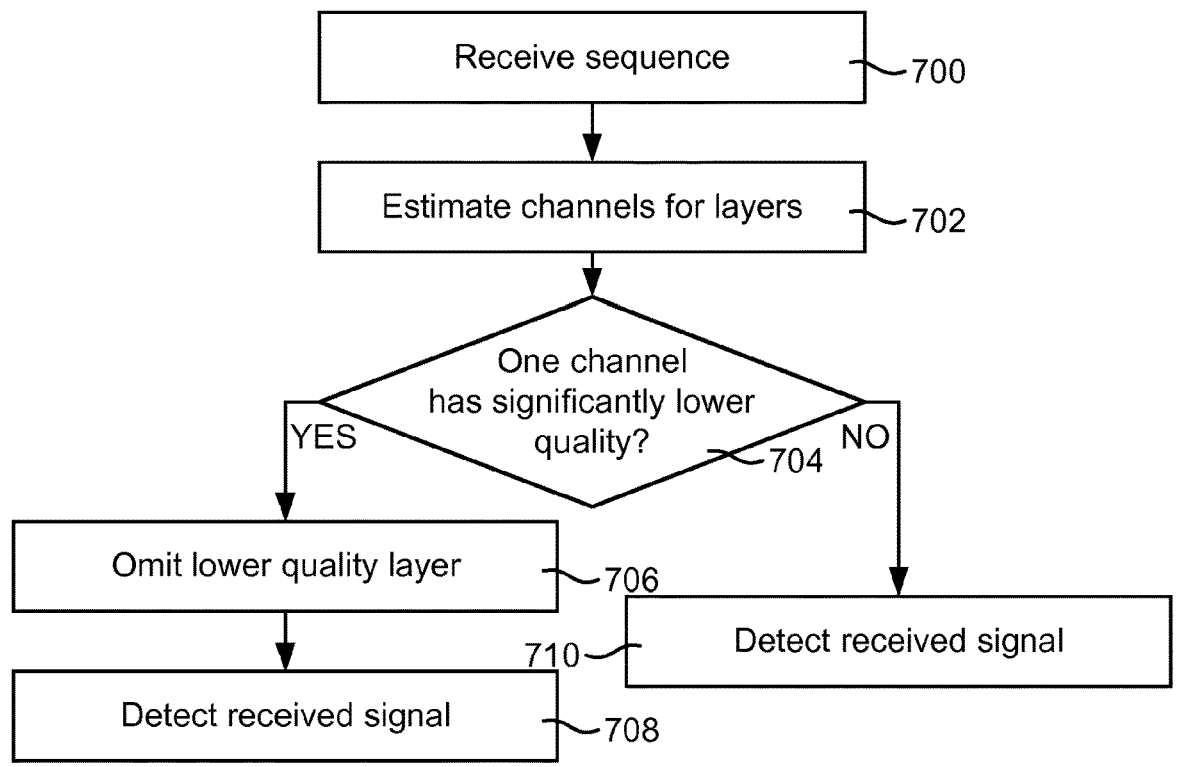
FIG. 7 is a flow chart schematically illustrating a receiver method according to an example.

FIG. 7 is a flow chart schematically illustrating methods of a receiver according to an example. The method comprises receiving 700 a signal representing a sequence of bits keyed and transmitted e.g. as demonstrated above. That is, the signal is multi-layered, wherein each layer may, due to the transmit diversity, have a channel which differs from the other layers. The channels are estimated 702 for the respective layers. It can then be determined 704 whether one of the channels have significantly lower channel quality. For example, channel gain such as $|h_1|$, $|h_2|$, etc. may be considered as a quality metric. A determined quality metric for the respective channels may be compared an a comparison result may in turn be compared with a threshold defining whether one channel has significantly lower quality. If no channel has significantly lower quality, the received signal is detected 710 using legacy procedures, i.e. performing detection on the whole received signal. However, if one channel has significantly lower quality, the signal part corresponding to the lower quality layer may be omitted 706 and detection 708 is performed on the remaining part of the received signal.

When different information, e.g. logical ones and zeros in case of binary information, is transmitted using different precoders, i.e., the actual selection of precoder is based on the information to be transmitted, there are different options for demodulating this information. What option is to be used may for instance be based on considering the trade-off between performance and complexity. To illustrate this, suppose binary information is transmitted using two antennas, and where one antenna is used for transmitting a logical zero, whereas the other antenna is used for transmitting a logical one.

At the receiver side, the goal is to determine whether a logical zero or a logical one was transmitted. The information is clearly transmitted over two different channels, where the first channel is from the first antenna at the transmitter to the antenna at the receiver, whereas the second channel is from the second antenna at the transmitter to the receiver. Typically, the two channels can be assumed to experience independent fading so that typically the channel quality of the two channels would be different and potentially very different. Intuitively, to obtain good receiver performance, one would like to use the better of the channels to a higher degree than worse of the two.

Let $h_0$ and $h_1$ denote the two channels and suppose a logical zero is transmitter over the channel $h_0$ and a logical one is transmitted over the channel $h_1$. Furthermore, without loss of generality, suppose $h_1$ is the better of the two channels. Specifically, suppose them magnitudes of $h_1$ is larger than the magnitude of $h_0$, i.e., $|h_1|>|h_0|$. Now, suppose the binary information is transmitted using the signal $s_1$ and a logical zero is transmitted using the signal $s_0$. The task for the receiver is to estimate whether $s_1$ or $s_0$ has been sent. With $|_1|>|_0|$ it is clear that the received signal will have better quality if $s_1$ is transmitted compared to if $s_0$ is transmitted, and therefore one may detect the $s_0$ as being present as soon as $s_1$ cannot be detected. Viewed in this way, the quality of the decision of $s_0$ being sent is effectively determined by the quality of $h_1$, rather than $h_0$, and thus the receiver performance will be determined by the best channel the logical zero in this example was transmitted over $h_0$ rather than $h_1$.

To make the example a bit more specific, suppose on-off keying (OOK) is used. In addition, suppose the data is Manchester code such that a logical one is represented by sending ON-OFF and a logical zero is represented by sending OFF-ON, respectively. A receiver for Manchester coded OOK makes a decision by comparing the first half of the signal with the second half of the signal. If the first part is larger, e.g. using some suitable metric like e.g. energy, than the second part, a decision is made in favour of a logical one being transmitted, since it is more likely that the actual sent signal was ON-OFF rather than OFF-ON. Clearly, if the OFF-ON is sent over the channel $h_0$ and ON-OFF is sent over the channel $h_1$, and comparing whether the first or second part of the signal contain most energy will not be a good approach if $h_1$ and $h_0$ are very different. Specifically, if $h_0$ is very small, the received power will be very small when $s_0$ is transmitted and thus the probability of making an error will approach 50% in case $s_0$ is transmitted. The corresponding error probability when $s_1$ is transmitted may, on the other hand, be very small. To address this issue, the receiver can instead modify how a decision is made and only use the standard approach when $|h_0|$ and $|h_1|$ are of approximately the same size. When one of the channels is much better than the other, the receiver instead bases its decision on whether the signal transmitted over the better of the two channels is present or not. Specifically if $h_1$ is found to be much better than $h_0$, and in case $s_1$ being transmitted it is estimated that the energy in the first half of the signal minus the energy in the second half of the signal should be $E_1$, then the receiver may decide that $s_1$ was transmitted in case the energy of the first half minus the second half exceeds $E_1/2$, i.e., half the expected energy. Effectively, the decision boundary for making a decision in favour of $s_1$ being sent has been shifted from zero to $E_1/2$ as an effect of that one is not explicitly looking for the signal $s_0$ but indirectly consider $s_0$ as being present if $s_1$ is absent. Considering this in view of the method demonstrated with reference to FIG. 7 above, the estimation 702 provides $|h_0|$ and $|h_1|$, and the determination 704 checks whether $||h_0|-|h_1||>E_1$, and if $s_0$, $s_1$ transmitted over $h_1$ is disregarded 706 and $s_1$ is considered transmitted in the detection 708 when $s_0$ is determined not to be present according to what is suggested above.

The approach described above can be viewed as very simple, but it is also clear that it may be sub-optimum. To fully explore the potential diversity gain it is desirable to use both channels $h_0$ and $h_1$ for making the decision, but in a way that it is taken into account that the channel quality is different. To do this, consider the following approach, again assuming Manchester coded OOK and that $|h_0|$ and $|h_1|$ are known, e.g. by the estimation. Making the assumption that the noise is Gaussian with variance $\sigma^2$, the probability density function (pdf) for the decision metric in case the decision metric is obtained by integrating the received signal, i.e., first half minus second half. In case $s_1$ is sent, the result is $$f_1(r) = \frac{1}{\sqrt{2\pi\sigma^2}} e^{-\frac{(r-s_1|h_1|)^2}{2\sigma^2}}$$

If instead $s_0$ is sent, the corresponding pdf becomes $$f_0(r) = \frac{1}{\sqrt{2\pi\sigma^2}} e^{-\frac{(r+s_0|h_0|)^2}{2\sigma^2}}$$

The log-likelihood can then be formed using $f_1(r)$ and $f_0(r)$ and if we normalize $s_1=s_0=1$ the result is that one should decide that $s_1$ was sent if $$r > \frac{|h_1| - |h_0|}{2}$$

It can be noted that in case the channels are equally good, the decision boundary becomes 0 and in case one would adopt the simplified approach of only using the better of the channels, the decision boundary becomes half of the expected value.

Figure 8:
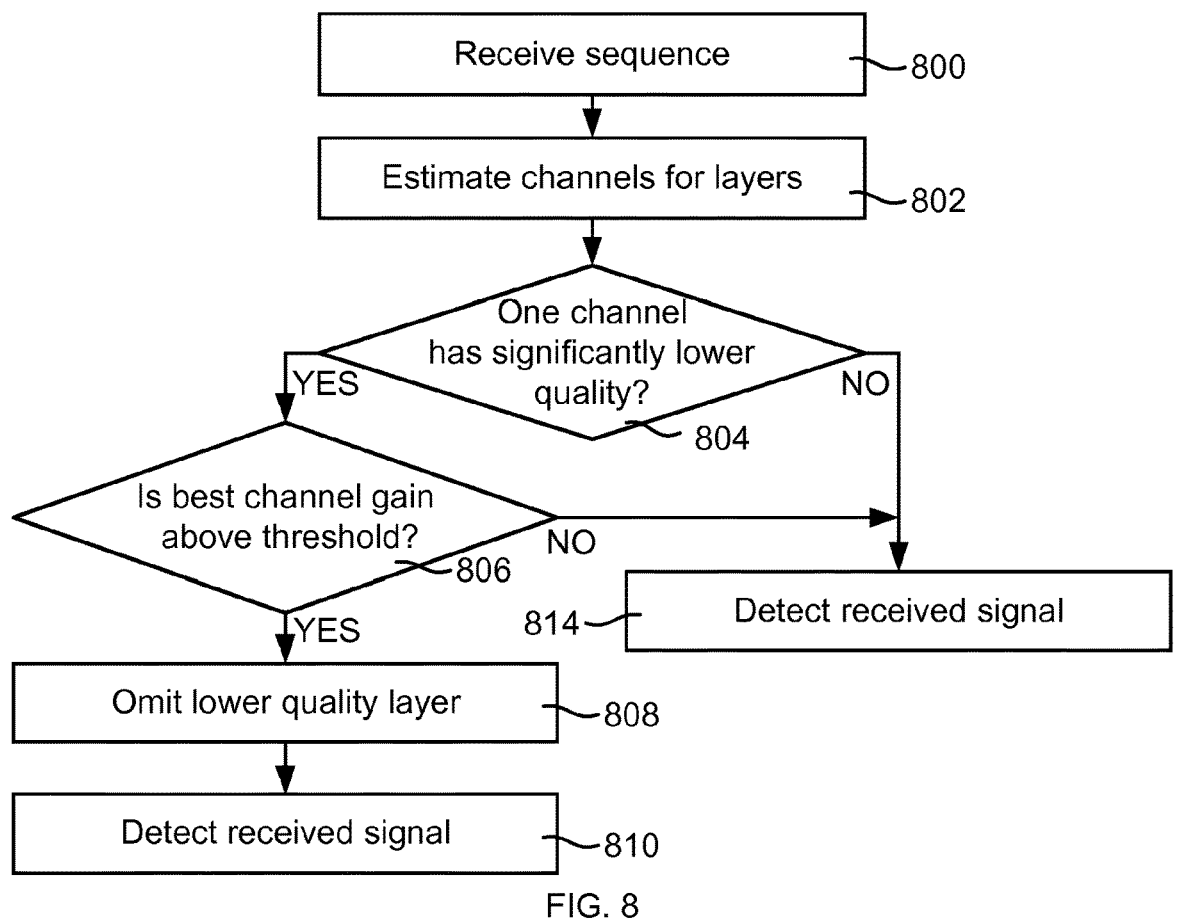
FIG. 8 is a flow chart schematically illustrating a receiver method according to an example.

FIG. 8 is a flow chart schematically illustrating methods of a receiver according to an example. The method comprises receiving 800 a signal representing a sequence of bits keyed and transmitted e.g. as demonstrated above. That is, the signal is multi-layered, wherein each layer may, due to the transmit diversity, have a channel which differs from the other layers. The channels are estimated 802 for the respective layers. It can then be determined 804 whether one of the channels have significantly lower channel quality. For example, channel gain such as $|h_1|$, $|h_2|$, etc. may be considered as a quality metric. A determined quality metric for the respective channels may be compared and a comparison result may in turn be compared with a first threshold defining whether one channel has significantly lower quality. If no channel has significantly lower quality, the received signal is detected 814 using legacy procedures. However, if one channel has significantly lower quality, it is determined 806 whether the best channel gain is above a second threshold. If it is, detection 810 is performed using received amplitudes or energy as demonstrated above. If not, there is likely no benefit with the special detection 810, and the signal is detected 814 in the conventional way.

Figure 9:
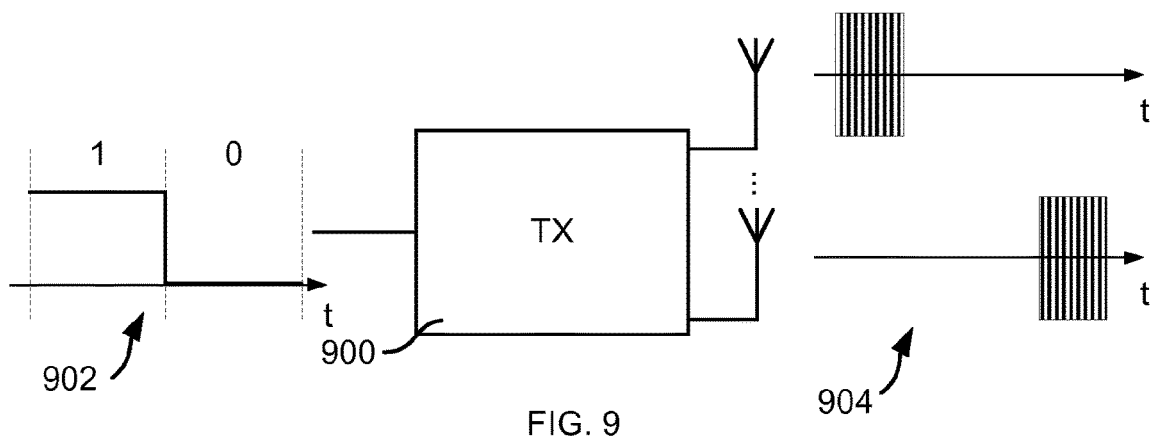
FIG. 9 schematically illustrates a transmitter according to an embodiment.

FIG. 9 schematically illustrates a transmitter 900 which is arranged to transmit binary information which uses the binary amplitude shift keying demonstrated above with reference to the different embodiments. Information symbols 902 are represented by a signal which is transmitted, including the multi-layered transmissions 904 demonstrated above, through two or more antennas. In FIG. 9, the multi-layered transmissions 904 are the example as of what is demonstrated with reference to FIG. 6, but any multi-layered transmissions demonstrated herein are of course equally feasible. The transmitter 900 typically is a part of an access point forming a network node of e.g. a radio access network.

Figure 10:
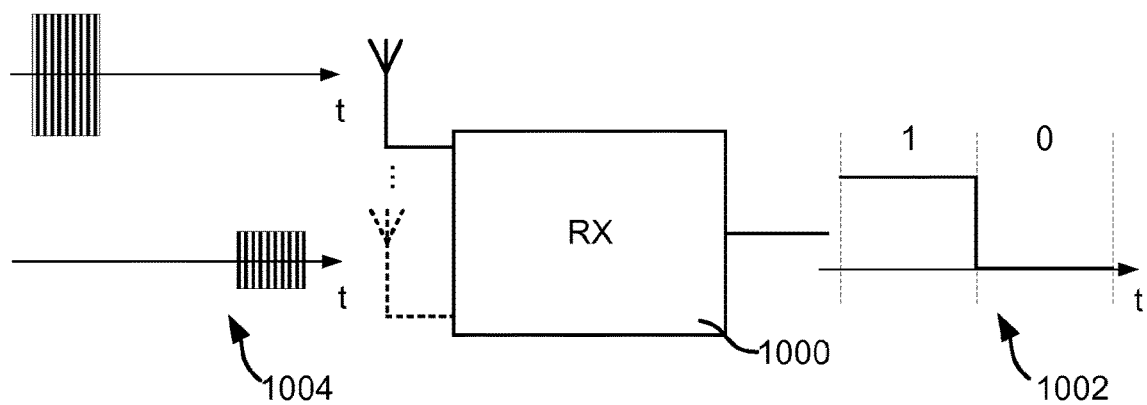
FIG. 10 schematically illustrates a receiver according to an embodiment.

FIG. 10 schematically illustrates a receiver 1000 according to an example which is arranged to receive binary information which uses the binary amplitude shift keying demonstrated above with reference to the different embodiments. Information symbols 1002 are represented by a received signal including the multi-layered transmissions 1004 demonstrated above. In FIG. 10, the multi-layered transmissions 1004 are the example as of what is demonstrated with reference to FIG. 8, but any multi-layered transmissions demonstrated herein are of course equally feasible The receiver 1000 is typically a part of a wireless communication device comprising a WUR and a main receiver or transceiver for PCR transmissions and arranged to be activated by the WUR. The receiver 1000 is then part of the WUR receiver. In FIG. 10, the receiver would typically only have one antenna, but depending on which precoder is used by the transmitter the receiver will effectively experience different channels. In FIG. 10 this is illustrated by a dashed antenna representing that one of the information bits is estimated using a different precoder than the other bit.

Figure 11:
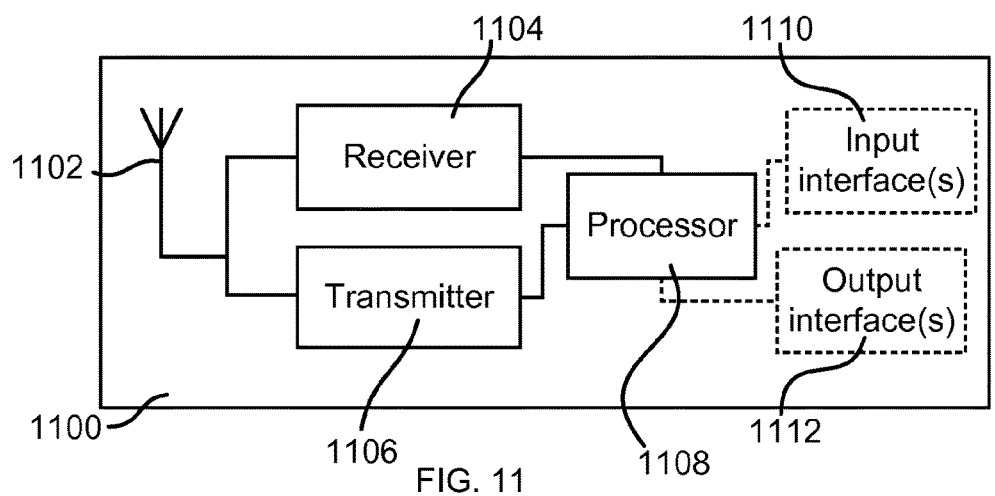
FIG. 11 is a block diagram schematically illustrating a communication device according to an embodiment.

FIG. 11 is a block diagram schematically illustrating a communication device 1100 according to an embodiment. The communication device comprises an antenna arrangement 1102, a receiver arrangement 1104 connected to the antenna arrangement 1102, a transmitter arrangement 1106 connected to the antenna arrangement 1102, a processing element 1108 which may comprise one or more circuits, one or more input interfaces 1110 and one or more output interfaces 1112. The interfaces 1110, 1112 can be operator interfaces and/or signal interfaces, e.g. electrical or optical. The communication device 1100 may be arranged to operate in a cellular communication network.

The communication device may according to embodiments be arranged such that the transmitter arrangement 1106 comprises a transmitter as demonstrated with reference to FIG. 9. In particular, by the processing element 1108 being arranged to perform the embodiments demonstrated above, the communication device 1100 is capable of transmitting a signal as demonstrated above. The communication device may according to embodiments be an access point providing a WUS as demonstrated above.

The communication device may according to examples be arranged such that the receiver arrangement 1104 comprises a receiver as demonstrated with reference to FIG. 10, forming a WUR arranged to provide activation signals upon reception of a proper WUS to a PCR receiver of the receiver arrangement 1104. The receiver arrangement 1104 is here to be regarded as either a single receiver used for both the signal demonstrated above, e.g. wake-up signal, paging signal, control signal, etc., and for other traffic, e.g. associated with a cellular or wireless local area network, or as a receiver arrangement comprising one receiver arranged for traffic associated with e.g. a cellular or wireless local area network, and another receiver arranged and dedicated to receive the signal demonstrated above. In particular, the communication device 1100 is in the example capable of receiving a multi-layered signal as demonstrated above. The communication device may according to the examples be a wireless communication device arranged for lean operation by being capable of receiving a WUS as demonstrated above.

The processing element 1108 can, for some of the embodiments and examples also fulfil a multitude of tasks, ranging from signal processing to enable reception and transmission since it is connected to the receiver 1104 and transmitter 1106, executing applications, controlling the interfaces 1110, 1112, etc.

Figure 12:
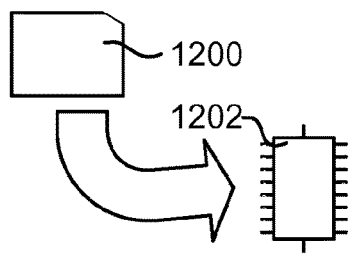
FIG. 12 schematically illustrates a computer-readable medium and a processing device.

The methods according to the present disclosure are suitable for implementation with aid of processing means, such as computers and/or processors, especially for the case where the processing element 1108 demonstrated above comprises a processor handling the precoding and transmission. Therefore, there is provided computer programs, comprising instructions arranged to cause the processing means, processor, or computer to perform the steps of any of the methods according to any of the embodiments described with reference to FIGS. 1 to 10. The computer programs preferably comprise program code which is stored on a computer readable medium 1200, as illustrated in FIG. 12, which can be loaded and executed by a processing means, processor, or computer 1202 to cause it to perform the methods, respectively, according to embodiments of the present disclosure, preferably as any of the embodiments described with reference to FIGS. 1 to 10. The computer 1202 and computer program product 1200 can be arranged to execute the program code sequentially, where actions of the any of the methods are performed stepwise, or be made to perform the actions on a real-time basis. The processing means, processor, or computer 1202 is preferably what normally is referred to as an embedded system. Thus, the depicted computer readable medium 1200 and computer 1202 in FIG. 12 should be construed to be for illustrative purposes only to provide understanding of the principle, and not to be construed as any direct illustration of the elements.

A receiver suitable to receive the transmissions to be transmitted by the above demonstrated transmitter, corresponding methods, and implementations thereof may according to examples provide features according to the following items:

1. A method of a receiver for receiving an amplitude shift keyed signal provided over a multi-layered transmission from a plurality of antennas with different precoding of different symbols for the respective layers, the method comprising
  receiving a sequence of signal values of the signal;
  estimating, from the sequence of signal values, channels for the respective layers; and
  selecting one of a plurality of detection methods based on a difference in quality between the estimated channels.

2. The method of item 1, the receiving comprising estimating signal values as energies of the signal by an envelope detector, and the estimating of the channels comprises estimating channel gain by selecting at least one signal value associated with respective layer and performing the estimation of the channels from the selected at least one signal value for respective layer.

3. The method of item 2, wherein the estimating of the channels comprises estimating phase differences between the channels.

4. The method of any one of items 1 to 3, wherein the signal is sent as a repeated symbol sequence for each layer, and the selecting of the detection method comprises determining whether one of the estimated channels has a significantly lower quality than another of the estimated channels, wherein if the one of the estimated channels has the significantly lower quality, the selected detection method comprises omitting a part of the signal with the lower quality and decoding the rest of the signal, or if there is no estimated channel having the significantly lower quality, the selected detection method comprises decoding the whole signal.

5. The method of item 4 and any one of items 2 or 3, wherein the determining whether the one of the estimated channels has significantly lower quality than the another of the estimated channels comprises determining whether difference between channel gains is greater than a first threshold.

6. The method of any one of items 1 to 3, wherein the selecting of the detection method comprises determining whether one of the estimated channels has a significantly lower quality than another of the estimated channels; and determining whether a largest of channel gain of one of the estimated channels and another of the estimated channels is greater than a second threshold, wherein if the one of the estimated channels has the significantly lower quality and the largest channel gain of the channel gains is greater than the second threshold, the selected detection method comprises omitting a part of the signal with the lower quality and decoding the rest of the signal, or otherwise, the selected detection method comprises decoding the whole signal.

7. The method of any one of items 2 or 3, wherein the signal is sent as a repeated symbol sequence for each layer, and the selecting of the detection method comprises determining whether a difference between channel gain of one of the estimated channels and another of the estimated channels is greater than a first threshold; and determining whether a largest of channel gain of one of the estimated channels and another of the estimated channels is greater than a second threshold, wherein if the one of the estimated channels has the difference in channel gains greater than the first threshold and the largest channel gain is greater than the second threshold, the selected detection method comprises omitting a part of the signal with the lower quality and decoding the rest of the signal, or otherwise, the selected detection method comprises decoding the whole signal.

8. A computer program comprising instructions which, when executed on a processor of a receiver, causes the receiver to perform the method according to any of claims 1 to 7.

9. A receiver arranged to receive an amplitude shift keyed signal provided over a multi-layered transmission with different precoding for the respective layers, arranged to receive a sequence of signal values of the signal;

estimate, from the sequence of signal values, channels for the respective layers; and select one of a plurality of detection methods based on a difference in quality between the estimated channels.

10. The receiver of item 9, comprising an envelope detector arranged to estimate signal values as energies of the signal, wherein the estimation of the channels comprises estimation of channel gain by selecting at least one signal value associated with respective layer and performing the estimation of the channels from the selected at least one signal value for respective layer.

11. The receiver of item 10, wherein the estimation of the channels comprises estimation of phase differences between the channels.

12. The receiver of any one of items 9 to 11, wherein the signal is sent as a repeated symbol sequence for each layer, wherein to select the detection method the receiver is arranged to determine whether one of the estimated channels has a significantly lower quality than another of the estimated channels, wherein if the one of the estimated channels has the significantly lower quality, the selected detection method comprises omitting a part of the signal with the lower quality and decoding the rest of the signal, or if there is no estimated channel having the significantly lower quality, the selected detection method comprises decoding the whole signal.

13. The receiver of item 12 and any one of items 10 or 11, wherein the determination whether the one of the estimated channels has significantly lower quality than the another of the estimated channels comprises a determination whether difference between channel gains is greater than a first threshold.

14. The receiver of any one of items 9 to 11, arranged to, for the selection of the detection method, determine whether one of the estimated channels has a significantly lower quality than another of the estimated channels; and determine whether a largest of channel gain of one of the estimated channels and another of the estimated channels is greater than a second threshold, wherein if the one of the estimated channels has the significantly lower quality and the largest channel gain of the channel gains is greater than the second threshold, the selected detection method comprises omitting a part of the signal with the lower quality and decoding the rest of the signal, or otherwise, the selected detection method comprises decoding the whole signal.

15. The receiver of any one of items 10 or 11, wherein the signal is sent as a repeated symbol sequence for each layer, wherein the receiver is arranged to, for the selection of the detection method, determine whether a difference between channel gain of one of the estimated channels and another of the estimated channels is greater than a first threshold; and determine whether a largest of channel gain of one of the estimated channels and another of the estimated channels is greater than a second threshold, wherein if the one of the estimated channels has the difference in channel gains greater than the first threshold and the largest channel gain is greater than the second threshold, the selected detection method comprises omitting a part of the signal with the lower quality and decoding the rest of the signal, or otherwise, the selected detection method comprises decoding the whole signal.

16. The receiver of any one of items 9 to 15, arranged to operate as a wake-up receiver arranged to control on and off states of a main transceiver, which is co-located or integrated with the receiver, based on the signal received by the receiver.

Other receivers and reception methods may be provided which are suitable to receive the transmissions provided by the transmission approach demonstrated above.

To demonstrate the performance of the two main schemes demonstrated above, the following simulations consider communication over a flat Rayleigh fading channel with each of the two transmit antennas subject to independent fading. The channel realizations are fixed for the duration of one packet. We consider 128-bit packets transmitted over a 4 MHz channel. The values of $|h_1|$ and $|h_2|$ are estimated blindly from the received signals.

Figure 13:
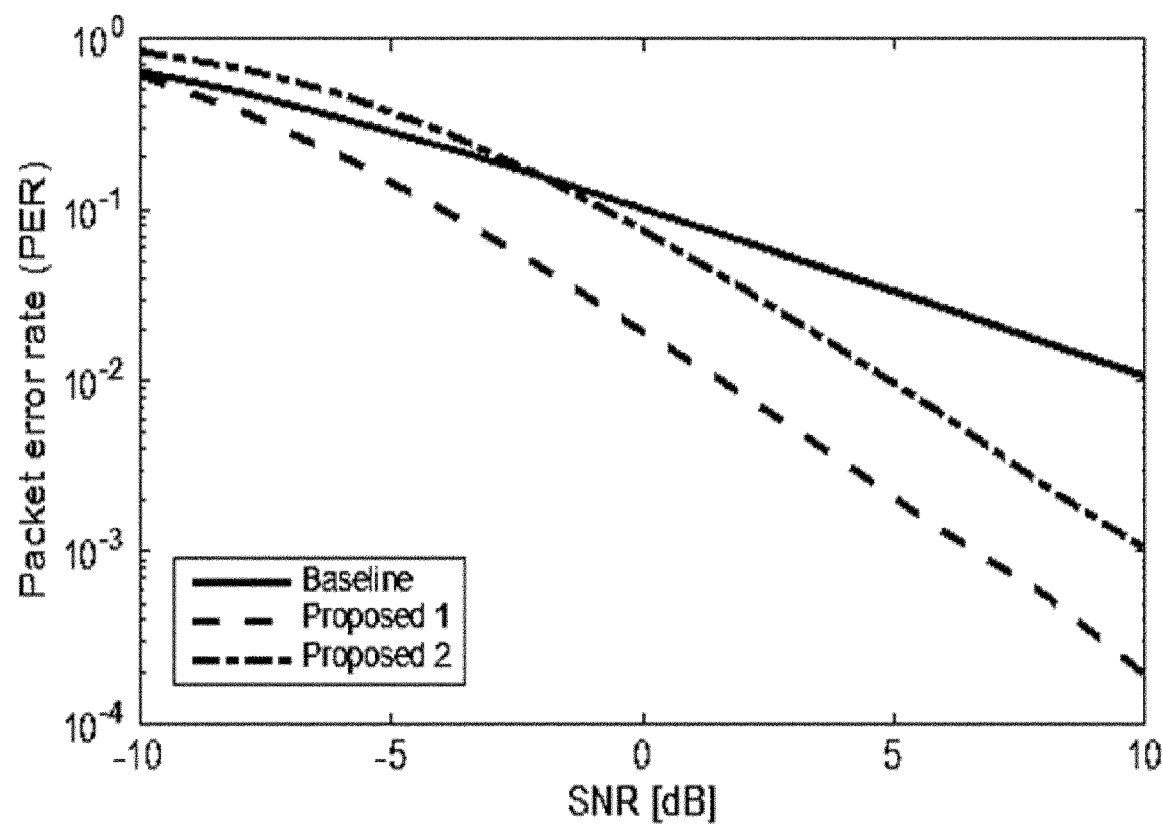
FIG. 13 is a graph showing packet error rate (PER) for some embodiments.

FIG. 13 shows the packet error rate (PER) with uncoded transmission as a function of the SNR over a 20 MHz channel using a rate of 62.5 kbit/s, where each symbol is encoded as either ON OFF ON OFF or OFF ON OFF ON. With the first scheme, employing the approach demonstrated e.g. with reference to FIGS. 5 and 7 above and marked "Proposed 1" in FIG. 13, different antennas are used for the first and second half of a symbol transmission. With the second scheme, employing the approach demonstrated e.g. with reference to FIGS. 6 and 8 above and marked "Proposed 2" in FIG. 13, "0" and "1" are transmitted using different antennas.

FIG. 13 shows that "Proposed 1" gives a lower PER than the baseline scheme, i.e. legacy approach, for any SNR and the slope is also steeper, which proves that the scheme successfully achieves transmit diversity against channel fading. "Proposed 2" achieves the same slope as "Proposed 1" and is preferable over the baseline scheme in the interval of interest, with PER of $10^{-1}$ and lower. However, at low signal-to-noise ratios (SNRs), "Proposed 2" gives higher PERs than the baseline scheme since the amplitudes of $|h_1|$ and $|h_2|$ are small and therefore the benefits of the scheme can seldom be utilized, i.e., the second threshold in comparison 806 of FIG. 8 is seldom satisfied.

Figure 14:
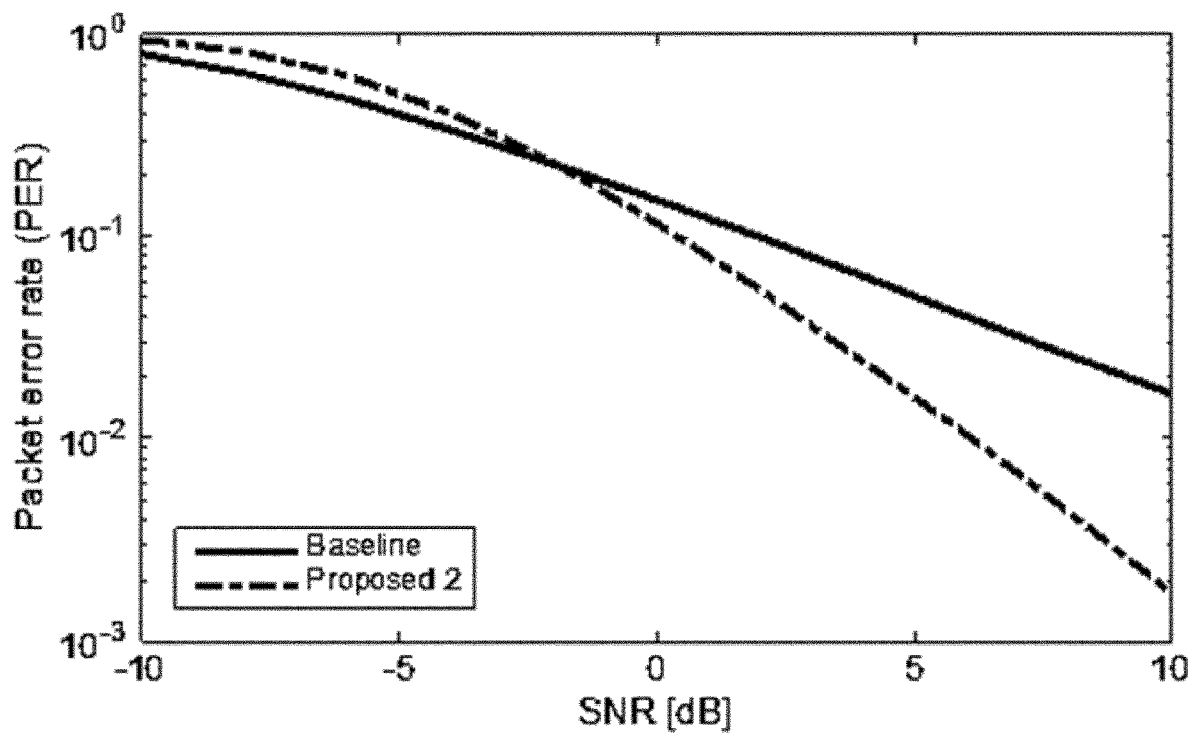
FIG. 14 is a graph showing packet error rate (PER) for some embodiments.

Next, we consider a rate of 125 kbit/s, where each symbol is encoded as either ON OFF or OFF ON. In this case, "Proposed 1" cannot be used and comparison is only made for the baseline scheme with "Proposed 2". FIG. 14 shows the PER as a function of the SNR over a 20 MHz channel. Similar to FIG. 13, in the interval of interest, with PER of $10^{-1}$ and downwards, "Proposed 2" outperforms the baseline scheme. Note that the curve of the proposed approach has a steeper slope, which proves that it successfully achieves transmit diversity against channel fading.

Further features may be employed with the approaches demonstrated above. In one embodiment, the matrix W is used to define lobes with pre-determined spatial directions. Instead of sending "0" and "1" through two of the antennas, the corresponding signals are sent in the pre-defined lobes. The receiver can then estimate the strength and the relative phase difference between the lobes.

In one embodiment, more than two antennas are used for precoding. For example, in the schemes "Proposed 1" and "Proposed 2", with two antennas, antenna 1 and antenna 2 are interchangeably used for the transmission. With more than two antennas, at each time instant the two antennas that are switched between may be selected according to some pre-determined pattern. Alternatively, the notation of "antenna 1" and "antenna 2" can be interpreted as virtual antennas created by two different precoding vectors, which are transmitted using more than two antennas.

In one embodiment, multiple WUS are multiplexed, e.g. for addressing different receivers. Different precoding patterns can be assigned to the different WUSs.

In one embodiment, additional side-information regarding a user, e.g., regarding previously successful transmission of a WUS, spatial directions, or other channel statistics, is utilized when selecting the precoding for said user. This information can also be used when selecting precoding for other users, to avoid interference.

In the description above, it is assumed in the given examples that the receiver is based on an envelope detector, since this is commonly used. The invention does rely on this being the case, however. Any receiver which is suitable for receiving OOK could benefit from the above described embodiments. As one specific example, instead of using the envelope of the signal, the power of the signal may be used. If the receiver is implemented in the digital domain, envelope or power will have essentially the same implementation complexity. If the receiver to a larger extent is implemented in the analog domain, it is more of a design choice whether an envelope or power detector is preferred.

The invention claimed is:

1. A method of transmitting a signal using a multi-layered transmission over a plurality of transmit antennas; the method comprising:
    amplitude shift keying a sequence of bits to generate the signal;
    precoding the signal to respective layers by applying different precoding vectors of a precoding matrix to different symbols of the signal to generate a different precoded signal for each of two or more layers; and
    transmitting each of the precoded signals over a respective antenna or set of antennas of the plurality of transmit antennas.

2. The method of claim 1, wherein, for each respective layer, a line of the precoding matrix determines the precoding for that layer.

3. The method of claim 2, further comprising selecting the precoding matrix from a set of matrices.

4. The method of claim 3, wherein the selecting of the precoding matrix is based on a mapping between precoding matrix and an addressed receiver of the transmission.

5. The method of claim 3, wherein for each matrix of the set of matrices, two of the lines are the same for all matrices and are arranged to be used for pilot symbols.

6. The method of claim 1, wherein the precoding is performed by:
    assigning a first part of the signal to a first layer; and
    assigning a second part of the signal to a second layer.

7. The method of claim 6, wherein the second part of the signal is a repeated replica of the first part of the signal.

8. The method of claim 1, wherein the precoding is performed by:
    assigning symbols for a first bit value to a first layer; and
    assigning symbols for a second bit value to a second layer.

9. The method of claim 1:
    wherein at least a part of the sequence comprises pilot bits;
    wherein the part of the signal corresponding to the pilot bits are precoded according to a predetermined precoding pattern.

10. The method of claim 1, wherein the signal comprises a wakeup signal (WUS).

11. A non-transitory computer readable recording medium storing a computer program product for controlling transmission of a signal using a multi-layered transmission over a plurality of transmit antennas, the computer program product comprising program instructions which, when run on processing circuitry of a transmitter, causes the transmitter to:

amplitude shift key a sequence of bits to generate the signal;

precode the signal to respective layers by applying different precoding vectors of a precoding matrix to different symbols the signal to generate a different precoded signal for each of two or more layers; and transmit each of the precoded signals over a respective antenna or set of antennas.

12. The non-transitory computer readable recording medium of claim 10, wherein the signal comprises a wakeup signal (WUS).

13. A transmitter for transmitting an amplitude shift keyed signal provided over a multi-layered transmission over a plurality of transmit antennas with different precoding of different symbols for the respective layers; the transmitter comprising:

processing circuitry;

memory containing instructions executable by the processing circuitry whereby the transmitter is operative to:

amplitude shift key a sequence of bits to generate the signal;

precode the signal to respective layers by applying different precoding vectors of a precoding matrix to different symbols the signal to generate a different precoded signal for each of two or more layers; and transmit each of the precoded signals over a respective antenna or set of antennas.

14. The transmitter of claim 13, wherein, for each respective layer, a line of the precoding matrix determines the precoding for that layer.

15. The transmitter of claim 14, wherein the instructions are such that the transmitter is operative to select the precoding matrix from a set of matrices.

16. The transmitter of claim 15, wherein for each matrix of the set of matrices, two of the lines are the same for all matrices and are arranged to be used for pilot symbols.

17. The transmitter of claim 13, wherein the precoding is such that:

a first part of the signal is assigned to a first layer; and a second part of the signal is assigned to a second layer.

18. The transmitter of claim 17, wherein the second part of the signal is a repeated replica of the first part of the signal.

19. The transmitter of claim 13, wherein the instructions are such that the transmitter is operative to, for the precoding:

assign symbols for a first bit value to a first layer; and assign symbols for a second bit value to a second layer.

20. The transmitter of claim 13, wherein the signal comprises a wakeup signal (WUS).

\* \* \* \* \*